(12) United States Patent
Belady et al.

(10) Patent No.: US 7,647,787 B2
(45) Date of Patent: Jan. 19, 2010

(54) UPGRADEABLE, MODULAR DATA CENTER COOLING APPARATUS

(75) Inventors: Christian L. Belady, McKinney, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 973 days.

(21) Appl. No.: 10/830,503

(22) Filed: Apr. 22, 2004

(65) Prior Publication Data

US 2005/0235671 A1    Oct. 27, 2005

(51) Int. Cl.
F25D 23/12    (2006.01)

(52) U.S. Cl. .................. 62/259.2; 62/407

(58) Field of Classification Search ............. 62/259.2, 62/407, 434; 361/698, 701
See application file for complete search history.

(56) References Cited

U.S. PATENT DOCUMENTS

| | | | | |
|---|---|---|---|---|
| 5,963,425 | A * | 10/1999 | Chrysler et al. | 361/695 |
| 2001/0042616 | A1 * | 11/2001 | Baer | 165/299 |
| 2001/0052235 | A1 * | 12/2001 | Durham | 62/175 |
| 2002/0104323 | A1 * | 8/2002 | Rash et al. | 62/176.1 |
| 2005/0122684 | A1 * | 6/2005 | Chu et al. | 361/698 |
| 2005/0126747 | A1 * | 6/2005 | Chu et al. | 165/11.1 |
| 2005/0225936 | A1 * | 10/2005 | Day | 361/687 |

* cited by examiner

Primary Examiner—Melvin Jones

(57) ABSTRACT

A data center is configured using alternating rows of racks containing heat-generating electronic devices and air conditioners. Fluid, such as water or a refrigerant, for the air conditioners is supplied through pluming below a raised floor, such as those commonly found in current data centers. Attached to this plumbing are standard fluid couplings configured to couple to either air conditioners or liquid cooling units. These air conditioners and liquid cooling units use the same fluid so that they may share the plumbing. As data center migrates to liquid-cooled racks, a fraction of the air conditioners are replaced with liquid conditioning units in such a way that the data center contains both air-cooled and liquid-cooled racks without substantial reduction in efficiency of the air-cooling system. Since the air conditioners and liquid conditioning units use the same couplings and the same fluid, no infrastructure change is required.

22 Claims, 7 Drawing Sheets

UPGRADEABLE, MODULAR DATA CENTER COOLING APPARATUS

FIELD OF THE INVENTION

The present invention relates generally to the field of computer data centers, and more particularly to the field of cooling computer data centers.

BACKGROUND OF THE INVENTION

Densification in data centers is becoming so extreme that the power density of the systems in the center is growing at a rate unmatched by technology developments in data center heating, ventilation, and air-conditioning (HVAC) designs. Current servers and disk storage systems generate 10,000 to 20,000 watts per square meter of footprint. Telecommunication equipment may generate two to three times the heat of the servers and disk storage systems. Liquid-cooled computers could solve this heat transfer problem, however, there is reluctance by both end users and computer manufacturers to make the transition from air-cooled computers to liquid-cooled computers. Also, there currently is no easy way to transition from an air-cooled data center to a liquid-cooled data center without a major overhaul of the data center and substantial down time to retrofit the data center.

Computer designers are continuing to invent methods that extend the air-cooling limits of individual racks of computers (or other electronic heat-generating devices) that are air-cooled. However, these high heat capacity racks require extraordinary amounts of air to remove the heat dissipated by the racks, requiring expensive and large air handling equipment.

Many modern data centers utilize a system utilizing a raised floor configured as a supply air plenum. Large HVAC units take air from near the ceiling of the data center, chill the air, and blow the cold air into the plenum under the raised floor. Vents in the floor near the servers allow cold air to be pulled up from the plenum, through the rack and the now warm air is blown out the back of the rack where it rises to the ceiling and eventually is pulled in to the HVAC units to begin the cycle anew. However, this type of system is limited in that it can only handle power of about 1600 to 2100 watts per square meter, significantly under the heat generated by many current electronic systems. Thus, the data center must contain significant amounts of empty space in order to be capable of cooling the equipment. Also, use of the under floor plenum has difficulties in that airflow is often impeded by cabling and other obstructions residing in the plenum. Further, perforated tiles limit airflow from the plenum into the data center to approximately 6 cubic meters per minute, well below the 60 cubic meters per minute required by some server racks. Even the use of blowers to actively pull cold air from the plenum and direct it to the front of the rack is insufficient to cool many modern servers. Balancing the airflow throughout the data center is difficult, and often requires a substantial amount of trial and error experimentation. Finally, the airflow is somewhat inefficient in that there is a substantial amount of mixing of hot and cold air in the spaces above the servers and in the aisles, resulting in a loss of efficiency and capacity.

In an attempt to increase the efficiency of raised floor plenum designs, some designers incorporate a large number of sensors through out the data center in an attempt to maximize the efficiency of the data center cooling with either static or dynamic provisioning cooling based on environmental parameters using active dampers and other environmental controls. Others may use a high pressure cooling system in an attempt to increase the cooling capacity of the raised floor plenum design. However this technique still has all of the inefficiencies of any raised floor plenum design and only increases the power handling capacity of the data center to about 3200 watts per square meter, still below the requirements of densely packed servers or telecommunication devices.

In a desperate attempt to increase cooling capabilities of a data center, some designers use an entire second floor to house their computer room air-conditioners (CRAC's). While this allows the use of large numbers of CRAC's without use of expensive data center floor space, it effectively acts as a large under floor plenum and is subject to the same inefficiencies and limitations of the under floor plenum design.

Other designers include air coolers within the server racks. For example, a liquid to air heat exchanger may be included on the back of a server rack to cool the air exiting the rack to normal room temperature. However, the airflow of the heat exchanger fans must match the airflow of the server precisely to avoid reliability and operational issues within the server. Also by mounting the heat exchanger on the racks, serviceability of the racks is reduced and the fluid lines attached to the rack must be disconnected before the rack may be moved. This results in less flexibility due to the presence of the liquid line and may require plumbing changes to the area where the rack is being moved to. Also, this technique does not directly cool the heat generating integrated circuits, it is simply a heat exchanger which is not as efficient as direct liquid cooling of the integrated circuits.

Another possibility is the use of overhead cooling which may offer cooling densities in the order of 8600 watts per square meter. However such overhead devices require a high ceiling that also must be strong enough to support the coolers. Also, in such a design, there is no easy migration route from air-cooled to liquid-cooled servers, and some users are concerned about the possibility of leaks from the overhead coolers dripping onto, and possibly damaging, their servers.

SUMMARY OF THE INVENTION

A data center is configured using alternating rows of racks containing other heat-generating electronic devices and air conditioners. Fluid, such as water or a refrigerant, for the air conditioners is supplied through pluming below a raised floor, such as those commonly found in current data centers. Attached to this plumbing are standard fluid couplings configured to couple to either air conditioners or liquid cooling units. These air conditioners and liquid cooling units use the same fluid so that they may share the plumbing. As data center migrates to liquid-cooled racks, a fraction of the air conditioners are replaced with liquid conditioning units in such a way that the data center contains both air-cooled and liquid-cooled racks without substantial reduction in efficiency of the air-cooling system. Since the air conditioners and liquid conditioning units use the same couplings and the same fluid, no infrastructure change is required.

Other aspects and advantages of the present invention will become apparent from the following detailed description, taken in conjunction with the accompanying drawings, illustrating by way of example the principles of the invention.

DETAILED DESCRIPTION

Figure 1:
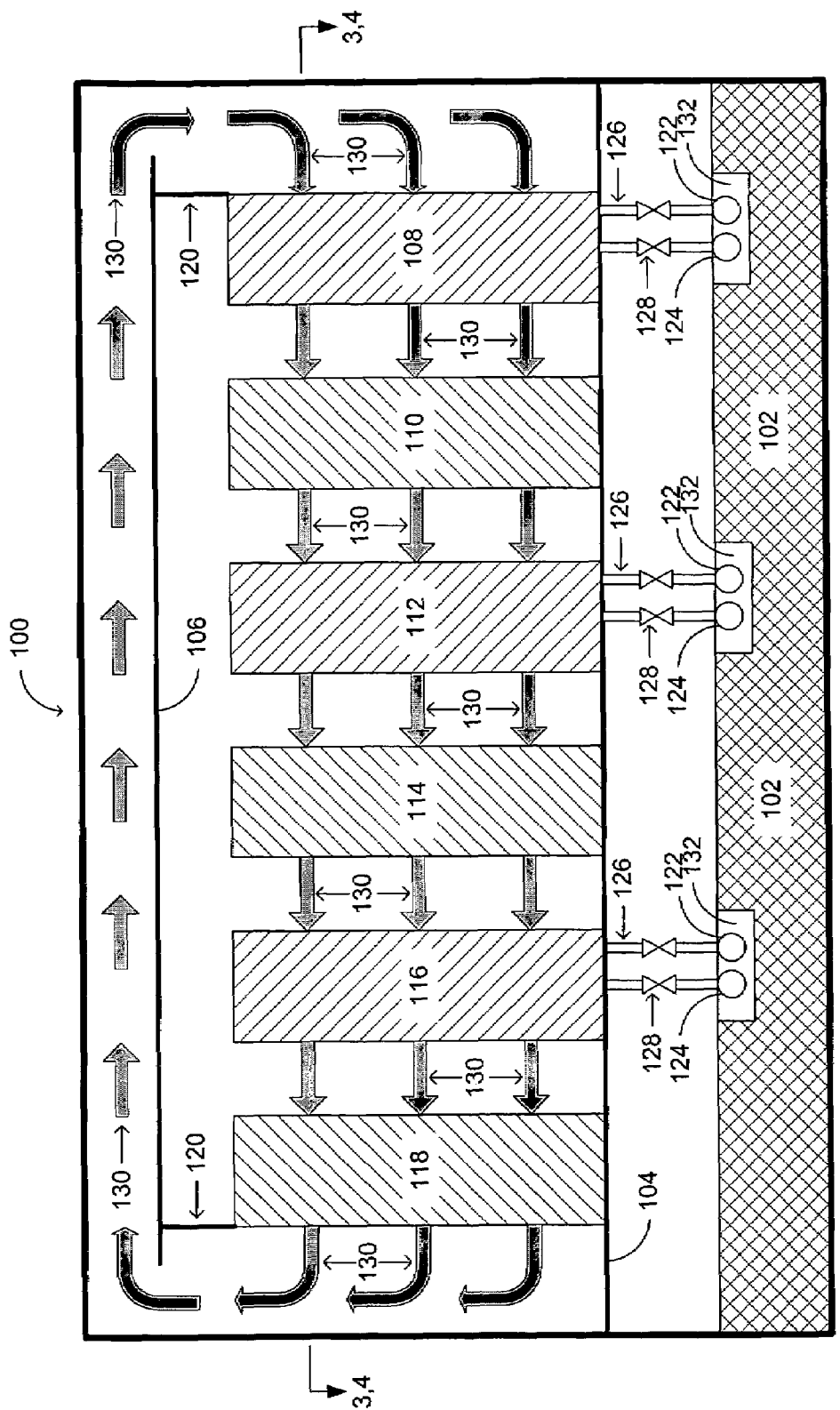
FIG. 1 is a side view of a data center including alternating air-cooled racks and air conditioners according to the present invention.

FIG. 1 is a side view of a data center including alternating air-cooled racks and 15 air conditioners according to the present invention. In this example embodiment of the present invention, a data center comprising a room 100 is built including a raised floor 104 and a foundation 102. Optionally, the room may include a false ceiling 106 for separation of the return airflow. Within the room 100 are a first air conditioning unit 108, a first rack 110, a second air conditioning unit 112, a second rack 114, a 20 third air conditioning unit 116, and a third rack 118. Note that in a typical data center each of these servers and air conditioning units are actually a single unit within a column of units. For example, the first rack 110 represented in this illustration may be a single server within a column of racks. See FIG. 3 for a top view of such a data center including three columns of racks and three columns of air conditioning units, one row of which is shown in FIG. 1. Airflow within the room 100 is shown by gray arrows labeled 130. Notice that the false ceiling 106 separates the warm airflow exiting the third rack 118 as it circulates back to the input of the first air conditioner 108 for increased efficiency. Optionally, small walls 120 may be used to direct the airflow up over the false ceiling, instead of allowing it to circulate back to the air input of the third rack 118. Likewise a small wall 120 is used to prevent the warm air returning from above the false ceiling 106 from bypassing the first air conditioner 108 and flowing directly into the air input of the first rack 110 without being properly cooled.

Underneath the raised floor 104 may be found the plumbing required by the air conditioning units. In this example embodiment of the present invention, a building chilled fluid supply is provided through chilled fluid supply pipes 122, and returned to the main chiller through chilled fluid return pipes 124 contained within trenches 132 in the foundation 102. This trench is optional, but provides a place for fluids to drain in the event of any leakage, and also by placing the chilled fluid supply pipes 122 and chilled fluid return pipes 124 in the trench, there is more room for cabling with less congestion. Each air conditioning unit is connected to these chilled fluid pipes through air conditioner pipes 126 which each include a fluid coupling 128. Note that the configuration of these pipes and couplings may vary widely according to the needs of each individual data center. In many cases water will be used as the chilled fluid, however other fluids, such as a liquid refrigerant (which may undergo a phase change during the coolant cycle), may be used in its place within the scope of the present invention.

Also note that while three rack and air conditioner pairs are shown in this figure, any number of rack and air conditioner pairs may be used in a similar configuration within the scope of the present invention. Also, as mentioned above, each of the racks and air conditioners shown in FIG. 1 may actually be a single server or rack of servers or air conditioner in a column of racks or air conditioners. In the context of this patent, the term "rack" is used as a generic term for any heat-generating electronic device configured in one or more racks. As noted in the background of the invention, telecommunications switching networks require large cooling capacity and may be configured in a manner similar to that shown in FIG. 1 within the scope of the present invention. The term "rack" is understood to include such switching networks, data storage arrays, servers, or any other heat generating electronic devices within the scope of the present invention. Also, those of skill in the art will recognize that the optional raised floor may be used for cabling, providing humidity or any other functions in addition to containing plumbing connections.

Those of skill in the art will recognize that there are a very wide variety of ways to configure data centers to take advantage of the present invention. There are many different ways to configure air-cooled racks with air conditioners such that the air-cooled racks may be replaced with liquid-cooled racks and the air conditioners may be replaced with liquid conditioning units without disrupting the airflow of any remaining air-cooled racks and air conditioners within the scope of the present invention. The Figures shown in this disclosure are simply a variety of example embodiments of the present invention, not a complete set of the various ways of implementing the present invention. For example, two story data centers may be build such that the air flows left to right on the first floor then is ducted up to the second floor where if flows right to left before being ducted back down to the first floor, completing the cycle.

Figure 2:
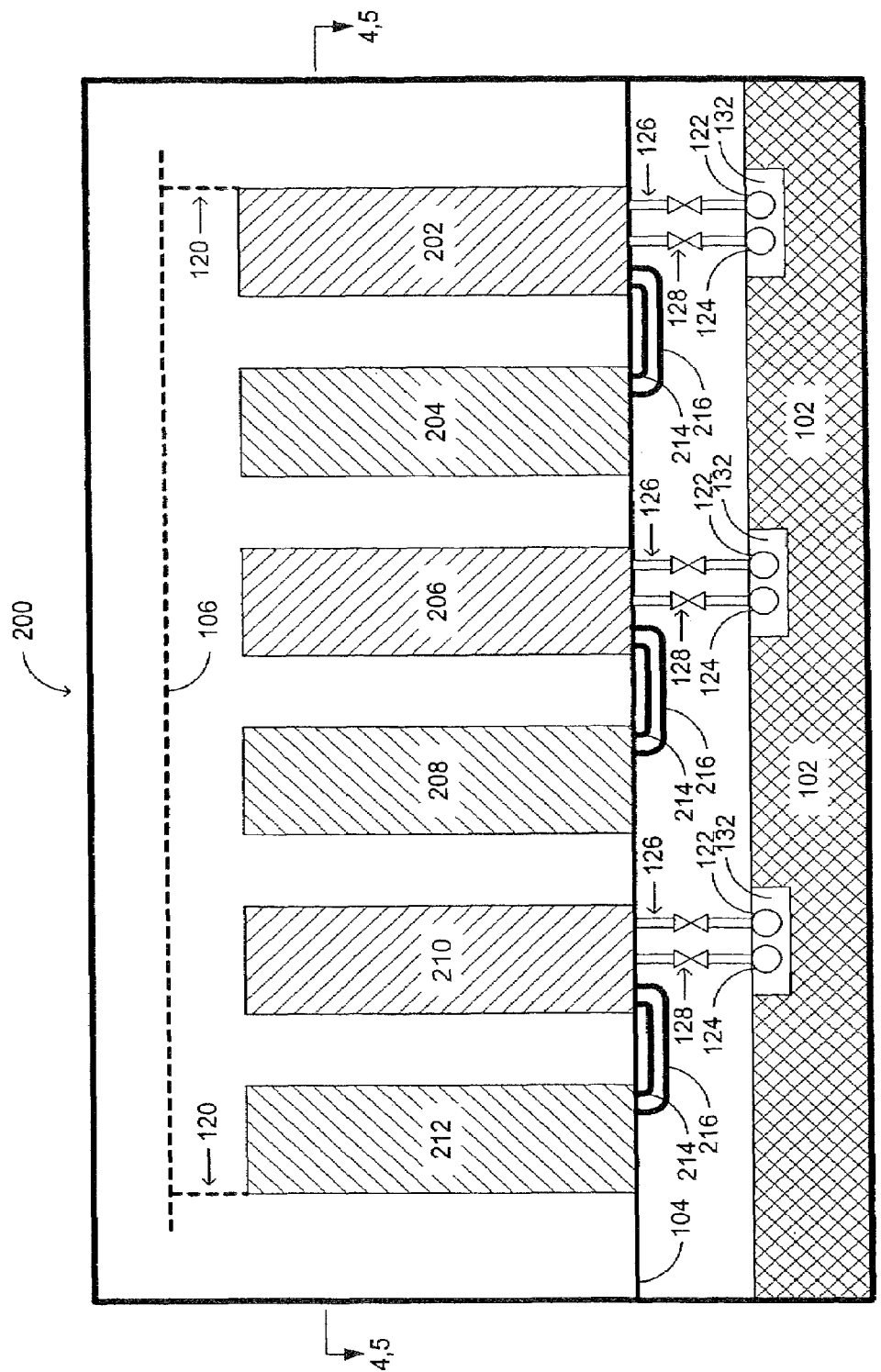
FIG. 2 is a side view of a data center including alternating liquid-cooled racks and liquid cooling units according to the present invention.

FIG. 2 is a side view of a data center including alternating liquid-cooled racks and liquid cooling units according to the present invention. In this example embodiment of the present invention, a data center comprising a room 200 is built including a raised floor 104 and a foundation 102. Optionally, the room may include a false ceiling 106 and small walls 120 as shown in FIG. 1 even though they are not required for the liquid-cooled rack configuration shown in the present illustration. Within the room 200 are a first liquid conditioning unit 202, a first rack 204, a second liquid conditioning unit 206, a second rack 208, a third liquid conditioning unit 210, and a third rack 212. Note that in a typical data center each of these racks and liquid conditioning units are actually a single unit within a column of units. For example, the first rack 204 represented in this illustration may be a single server within a column of racks. See FIG. 5 for a top view of such a data center including three columns of racks and three columns of liquid conditioning units, one row of which is shown in FIG. 2. The liquid conditioning units are connected with the racks through a pair of liquid supply pipes including a chilled liquid pipe 214 and a warm liquid pipe 216 used to return the now heated liquid from the servers to the liquid conditioning units.

Underneath the raised floor 104 may be found the plumbing required by the liquid conditioning units. In this example embodiment of the present invention, a building chilled fluid supply is provided through chilled fluid supply pipes 122, and returned to the main chiller through chilled fluid return pipes 124 contained within trenches 132 in the foundation 102. Each liquid conditioning unit is connected to these chilled fluid pipes through liquid conditioner pipes 126 which each include a fluid coupling 128. Note that the configuration of these pipes and couplings may vary widely according to the needs of each individual data center. For example, some data centers may be configured with the fluid supply pipes overhead instead of under a raised floor. However, the fluid couplings 128 must be configured to couple to both air conditioners and liquid conditioning units so that an air conditioner may be replaced by a liquid conditioning unit simply by disconnecting the fluid couplings 128 from the air conditioner and connecting the same fluid couplings 128 to the liquid conditioning unit. In many cases water will be used as the chilled fluid, however other fluids, such as a liquid refrigerant (which may undergo a phase change during the coolant cycle), may be used in its place within the scope of the present invention.

Also note that while three rack and liquid conditioner pairs are shown in this figure, any number of rack and liquid conditioner pairs may be used in a similar configuration within the scope of the present invention. Also, as mentioned above, each of the racks and liquid conditioners shown in FIG. 2 may actually be a single rack or liquid conditioner in a column of servers or air conditioners. In the context of this patent, the term "rack" is used as a generic term for any heat-generating electronic device configured in one or more racks. As noted in the background of the invention, telecommunications switching networks require large cooling capacity and may be configured in a manner similar to that shown in FIG. 2 within the scope of the present invention. The term "rack" is understood to include such switching networks, data storage arrays, servers, or any other heat generating electronic devices within the scope of the present invention.

Figure 3:
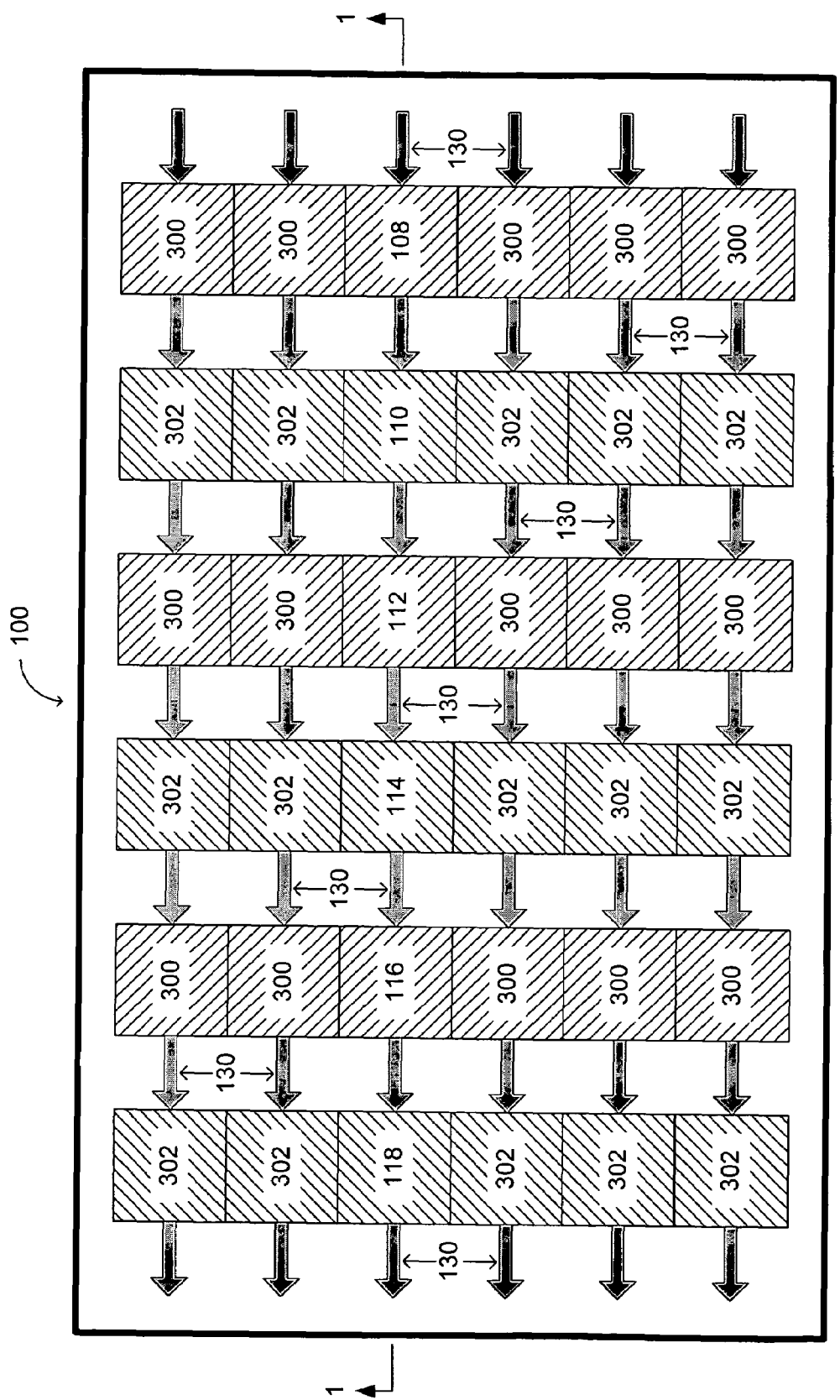
FIG. 3 is a top view of a data center including alternating air-cooled racks and air conditioners according to the present invention.

FIG. 3 is a top view of a data center including alternating air-cooled racks and air conditioners according to the present invention. In this example embodiment of the present invention, a data center containing 18 racks 302 and 18 air conditioning units 300 is built within a room 100. Note that while this example embodiment uses a 1:1 ratio of racks to air conditioning units, depending on the capacity of the air conditioning units and the thermal needs of the racks, other ratios of racks to air conditioning units may be used within the scope of the present invention. As in FIG. 1, airflow is represented by gray arrows labeled 130. Notice that the three pairs of racks and air conditioners shown in FIG. 1 are now seen to be individual racks and air conditioners each within a column of six racks 302 or six air conditioners 300. Air enters the first air conditioner 108 on the right hand side of this figure. Once the now-chilled air leaves the first air conditioner 108 it enters the air intake of the first rack 110. When the heated air leaves the first server 110 it flows into the air intake of the second air conditioner 112. Once the now-chilled air leaves the second air conditioner 112 it enters the air intake of the second rack 114. When the heated air leaves the second rack 114 it flows into the air intake of the third air conditioner 116. Once the now-chilled air leaves the third air conditioner 116 it enters the air intake of the third rack 118. Upon exiting the third rack 118 the now-heated air is re-circulated to the air intakes of the first air conditioner 108.

Figure 4:
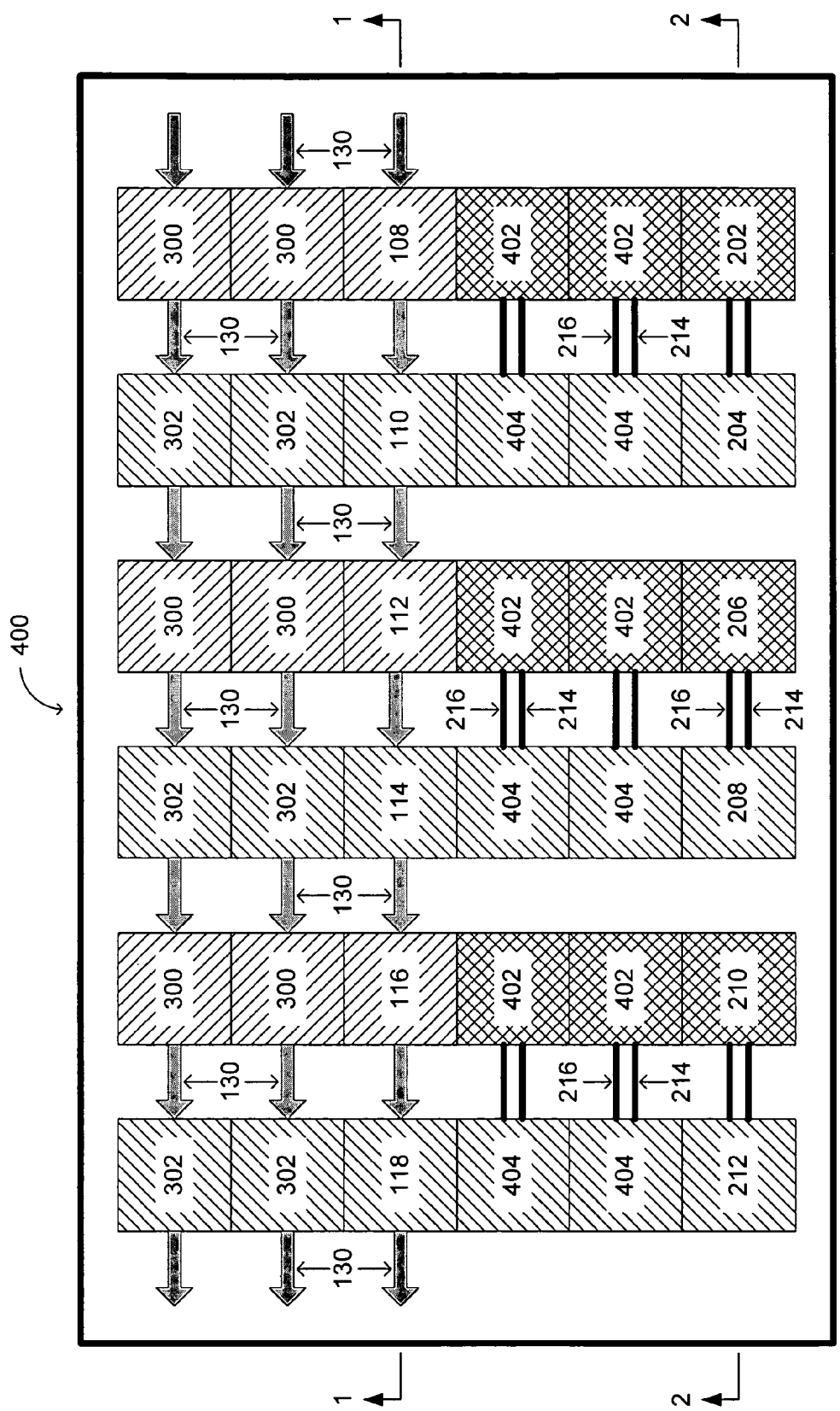
FIG. 4 is a top view of a data center, a fraction of which includes alternating air-cooled racks and air conditioners, while another fraction includes alternating liquid-cooled racks and liquid conditioning units according to the present invention.

FIG. 4 is a top view of a data center, a fraction of which includes alternating air-cooled racks and air conditioners, while another fraction includes alternating liquid-cooled racks and liquid conditioning units according to the present invention. This example embodiment of the present invention illustrates the ease with which the air-cooled racks may be replaced with liquid-cooled racks without disruption of the airflow required by the air-cooled racks and without changes in the infrastructure of the data center. In this example embodiment of the present invention, each column of racks comprises three liquid-cooled racks and three air-cooled servers. Likewise, each column of conditioners comprises three liquid conditioning units and three air conditioning units. While this example embodiment shows the liquid-cooled and air-cooled racks in a 1:1 ratio, those of skill in the art will recognize that using the configuration of the present invention, any ratio of liquid-cooled to air-cooled racks may be used without disruption of the airflow required by the air-cooled racks as long as each row of servers and conditioners is either air or liquid cooled, but not a combination of both. Airflow between the air-cooled racks 302 and the air conditioners 300 is once again represented by gray arrows labeled 130. Similarly, the connections between the liquid-cooled racks 404 and the liquid conditioning units 402 are shown as a chilled liquid pipe 214 and a warm liquid pipe 216 used to return the now-heated liquid from the liquid-cooled racks 404 to the liquid conditioning units 402.

Figure 5:
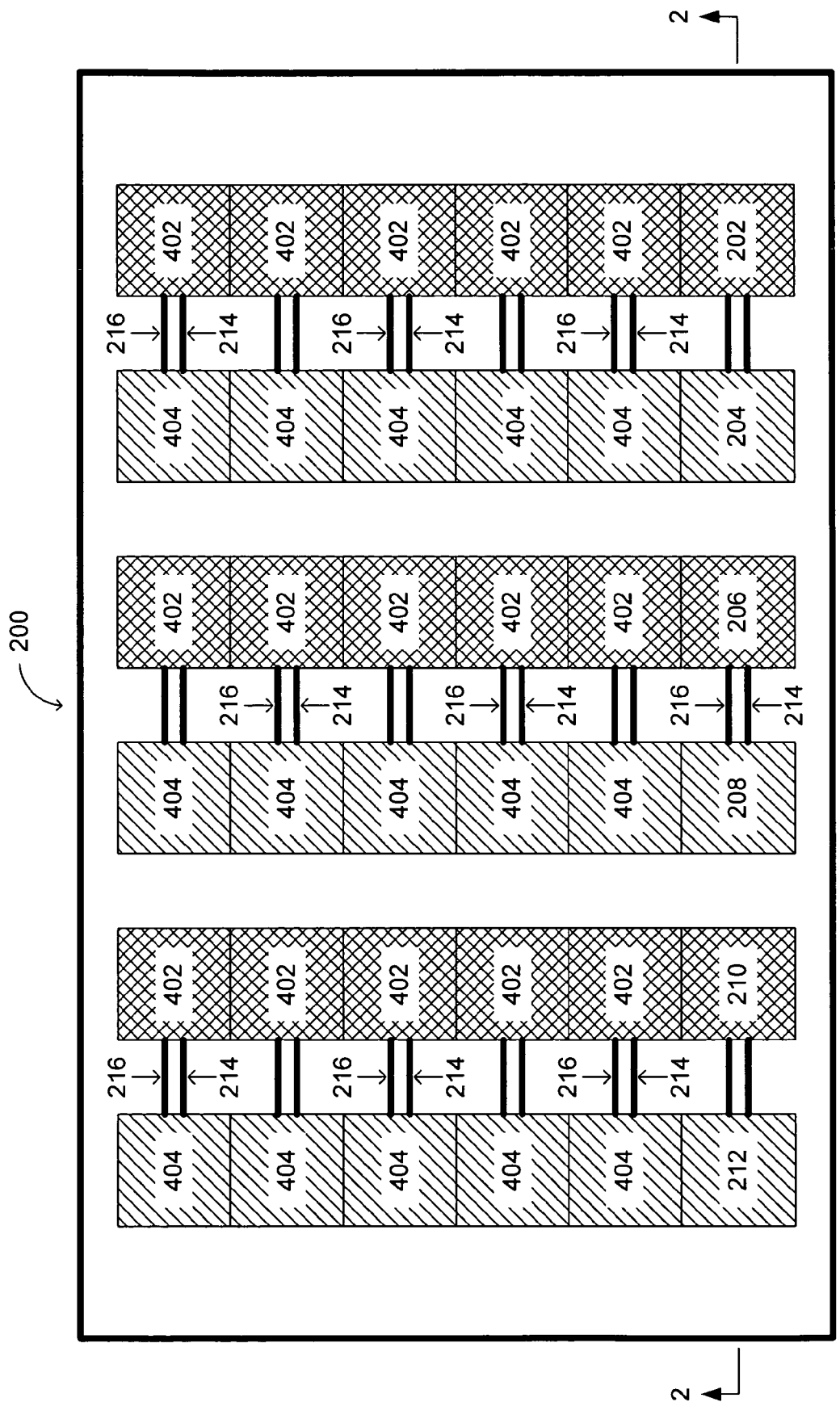
FIG. 5 is a top view of a data center including alternating liquid-cooled racks and liquid conditioning units according to the present invention.

FIG. 5 is a top view of a data center including alternating liquid-cooled racks and liquid conditioning units according to the present invention. Once the entire data center is converted to liquid-cooled racks 404 and liquid conditioning units 402, there is no longer any need for airflow within the data center, so none is shown in this example embodiment of the present invention. This example embodiment is similar to that shown in FIG. 4 with the exception that all of the air-cooled racks and air conditioners have now been replaced with liquid-cooled racks 404 and their corresponding liquid conditioning units 402 in a seamless migration without any infrastructure changes needed.

Figure 6:
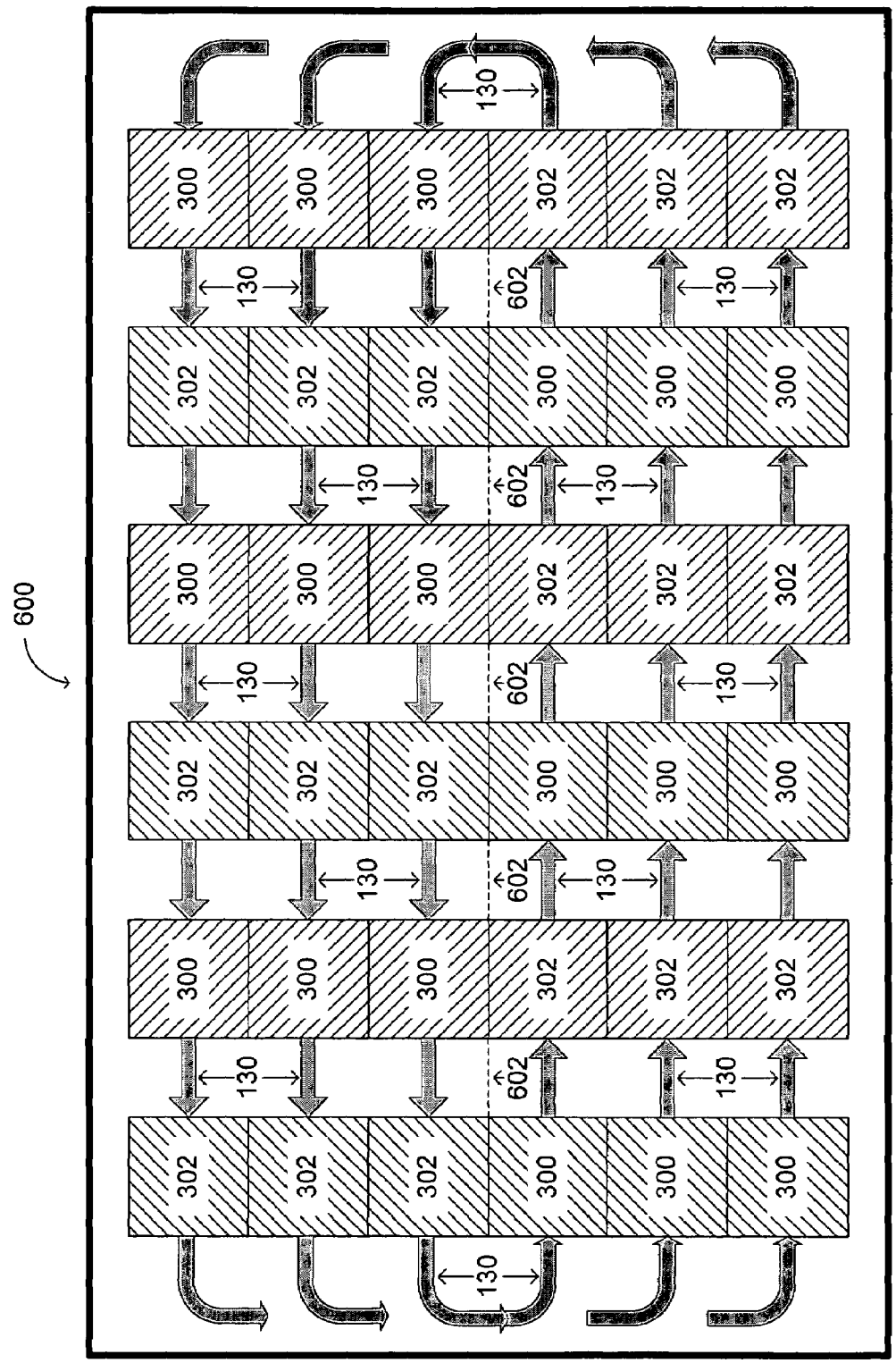
FIG. 6 is a top view of a data center including alternating air-cooled racks and air conditioners according to the present invention.

FIG. 6 is a top view of a data center including alternating air-cooled racks and air conditioners according to the present invention. This example embodiment of the present invention is an alternate configuration to that shown in FIGS. 1 and 3. In this example embodiment, the airflow cycle assumes a circular path around the perimeter of the room 600 instead of forming a vertical circular path along the ceiling of the room 600. Thus there is no longer any need for a false ceiling as shown in FIG. 1. However, to separate the airflows, it may be desirable to include some optional small walls 602 down the center of the data center. However, since at any given point along these optional small walls 602, the air temperature is roughly the same on both sides of the walls, they are not really necessary for cooling efficiency.

Those of skill in the art will recognize that this configuration of the present invention also allows easy transition from air-cooled racks to liquid-cooled racks by replacing a row at a time from the outside of the data center working in to the center of the room, or by replacing a row at a time from the inside of the data center working out to the edges of the room.

Figure 7:
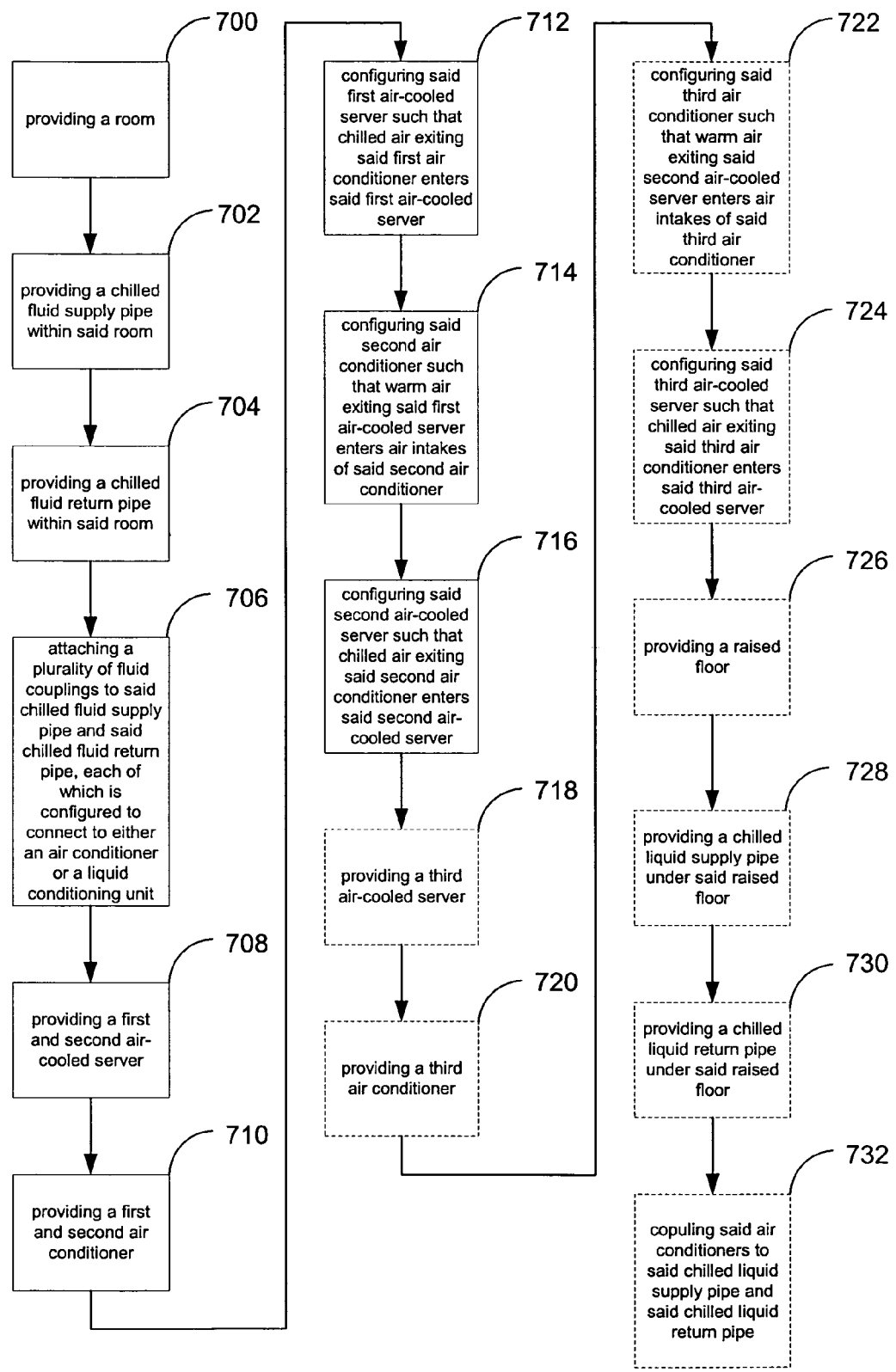
FIG. 7 is a flow chart of a method for configuring a data center with an upgradeable, modular cooling apparatus according to the present invention.

FIG. 7 is a flow chart of a method for configuring a data center with an upgradeable, modular cooling apparatus according to the present invention. In a step 700, a room is provided. In a step 702, a chilled fluid supply pipe is provided within said room. In a step 704, a chilled fluid return pipe is provided within said room In a step 706 a plurality of fluid couplings are attached to said chilled fluid supply pipe and said chilled fluid return pipe, wherein each of said fluid couplings is configured to connect to either an air conditioner or a liquid conditioning unit. In a step 708, first and second air-cooled servers are provided. In a step 710, first and second air conditioners are provided. In a step 712, the first air-cooled server is configured such that chilled air exiting said first air conditioner enters air intakes of said first air-cooled server. In a step 714, the second air conditioner is configured such that warm air exiting said first air-cooled server enters air intakes of said second air conditioner. In a step 716, the second air-cooled server is configured such that chilled air exiting said second air conditioner enters air intakes of said second air-cooled server. In an optional step 718, a third air-cooled server is provided. In an optional step 720, a third air conditioner is provided. In an optional step 722, the third air conditioner is configured such that warm air exiting said second air-cooled server enters air intakes of said third air conditioner. In an optional step 724, the third air-cooled server is configured such that chilled air exiting said third air conditioner enters air intakes of said third air-cooled server. In an optional step 726, a raised floor is provided. In an optional step 728, a chilled fluid supply pipe is provided under said raised floor. In an optional step 730, a chilled fluid return pipe is provided under said raised floor. In an optional step 732, the air conditioners are coupled to said chilled fluid supply pipe and said chilled fluid return pipe.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A data center comprising:
   a room;
   a chilled fluid supply pipe within said room;
   a chilled fluid return pipe within said room; and
   a plurality of fluid couplings connected with said chilled fluid supply pipe and said chilled fluid return pipe each of which is configured to connect to either an air conditioner or a liquid conditioning unit where the air conditioner and the liquid conditioning unit are both connected to at least one shared pipe.

2. A data center as recited in claim 1 further comprising:
   a raised floor, wherein said chilled fluid supply pipe is under said raised floor, and wherein said chilled fluid return pipe is under said raised floor.

3. A data center as recited in claim 1, further comprising:
   at least one row of air-cooled servers and air conditioners within said room comprising:
      a first air conditioner coupled to said chilled fluid supply pipe through one of said fluid couplings, and coupled to said chilled fluid return pipe through another of said fluid couplings;
      a first air-cooled server configured such that chilled air exiting said first air conditioner enters air intakes of said first air-cooled server;
      a second air conditioner coupled to said chilled fluid supply pipe through one of said fluid couplings, and coupled to said chilled fluid return pipe through another of said fluid couplings, and configured such that warm air exiting said first air-cooled server enters air intakes of said second air conditioner; and
      a second server configured such that chilled air exiting said second air conditioner enters air intakes of said second air-cooled server.

4. A data center as recited in claim 3,
   wherein said first air conditioner is configured such that warm air exiting said second air-cooled server enters air intakes of said first air conditioner.

5. A data center as recited in claim 3,
   wherein said at least one row of air-cooled servers and air conditioners within said room further comprises:
      a third air conditioner coupled to said chilled fluid supply pipe through one of said fluid couplings, and coupled to said chilled fluid return pipe through another of said fluid couplings, and configured such that warm air exiting the second air-cooled server enters air intakes of said third air conditioner; and
      a third air-cooled server configured such that chilled air exiting said third air conditioner enters air intakes of said third air-cooled server; and
      wherein said first air conditioner is configured such that warm air exiting said third air-cooled server enters air intakes of said first air conditioner.

6. A data center as recited in claim 3 further comprising:
   a false ceiling above said row of air-cooled servers and air conditioners.

7. A data center as recited in claim 6,
   wherein said false ceiling is configured to separate a flow of warm air to an air intake of said first air conditioner from chilled air flowing from said air conditioners to said servers.

8. A data center as recited in claim 1, further comprising:
   at least one row of air-cooled servers and air conditioners within said room comprising:
      a first air conditioner coupled to said chilled fluid supply pipe through one of said fluid couplings, and coupled to said chilled fluid return pipe through another of said fluid couplings;
      a first air-cooled server configured such that chilled air exiting said first air conditioner enters air intakes of said first air-cooled server;
      a second air conditioner coupled to said chilled fluid supply pipe through one of said fluid couplings, and coupled to said chilled fluid return pipe through another of said fluid couplings, and configured such that warm air exiting said first air-cooled server enters air intakes of said second air conditioner; and
      a second server configured such that chilled air exiting said second air conditioner enters air intakes of said second air-cooled server; and
   at least one row of liquid-cooled servers and liquid conditioning units within said room comprising:
      a first liquid conditioning unit coupled to said chilled fluid supply pipe through one of said fluid couplings, and coupled to said chilled fluid return pipe through another of said fluid couplings;
      a first liquid-cooled server;
      a first chilled liquid pipe configured to flow chilled liquid from said first liquid conditioning unit to said first liquid-cooled server; and
      a first warm fluid pipe configured to flow warm liquid from said first liquid-cooled server to said first liquid conditioning unit.

9. A data center as recited in claim 8,
   wherein said at least one row of air-cooled servers and liquid conditioning units within said room further comprises:
      a second liquid conditioning unit coupled to said chilled fluid supply pipe through one of said fluid couplings, and coupled to said chilled fluid return pipe through another of said fluid couplings;
      a second liquid-cooled server
      a second chilled liquid pipe configured to flow chilled liquid from said second liquid conditioning unit to said second liquid-cooled server; and a second warm liquid pipe configured to flow warm liquid from said second liquid-cooled server to said second liquid conditioning unit.

10. A data center as recited in claim 8,
wherein said at least one row of liquid-cooled servers and liquid conditioning units within said room further comprises:
a third liquid conditioning unit coupled to said chilled fluid supply pipe through one of said fluid couplings, and coupled to said chilled fluid return pipe through another of said fluid couplings;
a third liquid-cooled server;
a third chilled liquid pipe configured to flow chilled liquid from said third liquid conditioning unit to said third liquid-cooled server; and
a third warm liquid pipe configured to flow warm liquid from said third liquid-cooled server to said third liquid conditioning unit.

11. A data center as recited in claim 8, further comprising:
a raised floor upon which said at least one row of air-cooled servers and air conditioners and said at least one row of liquid-cooled servers and liquid conditioning units rests;
wherein said chilled fluid supply pipe is under said raised floor;
wherein said chilled fluid return pipe is under said raised floor;
air conditioner pipes configured to couple said air conditioners to said chilled fluid supply pipe and said chilled fluid return pipe through said fluid couplings; and
liquid conditioner pipes configured to couple said liquid conditioning units to said chilled fluid supply pipe and said chilled fluid return pipe through said fluid couplings.

12. A data center as recited in claim 8 further comprising:
a false ceiling above said row of air-cooled servers and air conditioners.

13. A data center as recited in claim 12,
wherein said false ceiling is configured to separate a flow of warm air to an air intake of said first air conditioner from chilled air flowing from said air conditioners to said servers.

14. A data center as recited in claim 1, further comprising:
at least one row of liquid-cooled servers and liquid conditioning units within said room comprising:
a first liquid conditioning unit coupled to said chilled fluid supply pipe through one of said fluid couplings, and coupled to said chilled fluid return pipe through another of said fluid couplings;
a first liquid-cooled server;
a first chilled liquid pipe configured to flow chilled liquid from said first liquid conditioning unit to said first liquid-cooled server; and
a first warm liquid pipe configured to flow warm liquid from said first liquid-cooled server to said first liquid conditioning unit.

15. A data center as recited in claim 14,
wherein said at least one row of liquid-cooled servers and liquid conditioning units within said room further comprises:
a second liquid conditioning unit coupled to said chilled fluid supply pipe through one of said fluid couplings, and coupled to said chilled fluid return pipe through another of said fluid couplings;
a second liquid-cooled server;
a second chilled liquid pipe configured to flow chilled liquid from said second liquid conditioning unit to said second liquid-cooled server; and
a second warm liquid pipe configured to flow warm liquid from said second liquid-cooled server to said second liquid conditioning unit.

16. A data center as recited in claim 14,
wherein said at least one row of liquid-cooled servers and liquid conditioning units within said room comprises:
a third liquid conditioning unit coupled to said chilled fluid supply pipe through one of said fluid couplings, and coupled to said chilled fluid return pipe through another of said fluid couplings;
a third liquid-cooled server;
a third chilled liquid pipe configured to flow chilled liquid from said third liquid conditioning unit to said third liquid-cooled server; and
a third warm liquid pipe configured to flow warm liquid from said third liquid-cooled server to said third liquid conditioning unit.

17. A data center as recited in claim 14, further comprising:
a raised floor upon which said at least one row of liquid-cooled servers and liquid conditioning units rests;
wherein said chilled fluid supply pipe is under said raised floor;
wherein said chilled fluid return pipe is under said raised floor; and
liquid conditioner pipes configured to couple said liquid conditioning units to said chilled fluid supply pipe and said chilled fluid return pipe through said fluid couplings.

18. A method for configuring servers within a data center comprising:
a. providing a room;
b. providing a chilled fluid supply pipe within said room;
c. providing a chilled fluid return pipe within said room; and
d. attaching a plurality of fluid couplings to said chilled fluid supply pipe and said chilled fluid return pipe, wherein said each of said connectors is configured to connect to either an air conditioner or a liquid conditioning unit;
e. providing a first and second air-cooled server;
f. providing a first and second air conditioner, connected to said chilled fluid supply pipe and to said chilled fluid return pipe through said fluid couplings;
g. configuring said first air-cooled server such that chilled air exiting said first air conditioner enters air intakes of said first air-cooled server;
h. configuring said second air conditioner such that warm air exiting said first air-cooled server enters air intakes of said second air conditioner; and
i. configuring said second air-cooled server such that chilled air exiting said first air conditioner enters air intakes of said second air-cooled server.

19. A method for configuring servers within a data center as recited in claim 18, further comprising:
j. configuring said first air conditioner such that warm air exiting said second air-cooled server enters air intakes of said first air conditioner.

20. A method for configuring servers within a data center as recited in claim 18, further comprising:
j. providing a third air-cooled server;
k. providing a third air conditioner, connected to said chilled fluid supply pipe and to said chilled fluid return pipe through said fluid couplings;
l. configuring said third air conditioner such that warm air exiting said second air-cooled server enters air intakes of said third air conditioner; and m. configuring said third air-cooled server such that chilled air exiting said third air conditioner enters air intakes of said third air-cooled server.

21. A method for configuring servers within a data center as recited in claim 18, further comprising:
   j. providing a raised floor upon which said air-cooled servers and said air conditioners rest; wherein said chilled fluid supply pipe and said chilled fluid return pipe are under said raised floor.

22. A method for configuring servers within a data center as recited in claim 18, wherein said air conditioners are configured such that they can be replaced with a liquid conditioning unit without any changes in data center infrastructure.

* * * * *

UNITED STATES PATENT AND TRADEMARK OFFICE
CERTIFICATE OF CORRECTION

PATENT NO. : 7,647,787 B2
APPLICATION NO. : 10/830503
DATED : January 19, 2010
INVENTOR(S) : Christian L. Belady et al.

Page 1 of 1

It is certified that error appears in the above-identified patent and that said Letters Patent is hereby corrected as shown below:

In column 8, line 64, in Claim 9, delete "server" and insert -- server; --, therefor.

Signed and Sealed this

Twenty-seventh Day of April, 2010

David J. Kappos
*Director of the United States Patent and Trademark Office*